United States Patent
Friedberg et al.

(10) Patent No.: US 6,320,469 B1
(45) Date of Patent: Nov. 20, 2001

(54) LOCK DETECTOR FOR PHASE-LOCKED LOOP

(75) Inventors: Donald H. Friedberg, Breinigsville; Dale Harvey Nelson, Shillington; Lai Q. Pham, Center Valley, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/504,397

(22) Filed: Feb. 15, 2000

(51) Int. Cl.[7] .................................................. H03L 7/095
(52) U.S. Cl. ........................ 331/1 A; 331/16; 331/18; 331/25; 331/DIG. 2; 327/156; 327/157; 327/159
(58) Field of Search ..................... 331/1 A, 4, 11, 331/16, 18, 25, DIG. 2; 327/156–159

(56) References Cited

U.S. PATENT DOCUMENTS

| | | | |
|---|---|---|---|
| 3,956,710 | | 5/1976 | Seitz et al. . |
| 4,287,529 | * | 9/1981 | Tatami et al. ............................. 358/8 |
| 4,982,110 | * | 1/1991 | Yokogawa et al. .................. 307/269 |
| 5,124,671 | * | 6/1992 | Srivastava ............................... 331/10 |
| 5,220,295 | * | 6/1993 | Glover et al. ........................... 331/25 |
| 5,394,444 | * | 2/1995 | Silvey et al. .......................... 375/374 |
| 5,406,592 | * | 4/1995 | Baumert ................................ 375/376 |
| 5,512,860 | * | 4/1996 | Huscroft et al. ..................... 331/1 A |
| 5,530,383 | * | 6/1996 | May ........................................ 327/39 |
| 5,656,977 | * | 8/1997 | Kelkar et al. .......................... 331/25 |
| 5,680,076 | | 10/1997 | Kelkar et al. . |
| 5,696,462 | * | 12/1997 | Maturi et al. ......................... 327/151 |
| 5,870,002 | | 2/1999 | Ghaderi et al. . |
| 5,886,582 | | 3/1999 | Stansell . |
| 5,987,085 | * | 11/1999 | Anderson ............................. 375/374 |
| 6,075,415 | * | 6/2000 | Milton et al. .......................... 331/25 |
| 6,215,834 | * | 4/2001 | McCollough ........................ 375/375 |

* cited by examiner

*Primary Examiner*—David Mis
(74) *Attorney, Agent, or Firm*—Duane, Morris & Heckscher LLP

(57) ABSTRACT

A method and lock detector for detecting lock between a reference signal and a feedback signal of a PLL circuit. A number of clock cycles of the feedback signal is counted during consecutive test intervals defined by the reference signal. A feedback comparator determines whether the number of clock cycles of the feedback signal during a given test interval is within an expected range. Before lock has been indicated, a qualification counter is either incremented or reset after each test interval in accordance with the expected range determination. A lock indication signal indicating that lock has been achieved is provided if said qualification counter exceeds a qualification threshold.

14 Claims, 3 Drawing Sheets

100

220

LOCK DETECTOR FOR PHASE-LOCKED LOOP

BACKGROUND OF THE INVENTION

1. Field of the Invention

The present invention relates phase-locked loop (PLL) frequency synthesizers and, in particular, to lock detectors for detecting when frequency and phase of the output clock signal generated by the PLL matches that of an input clock signal.

2. Description of the Related Art

Frequency synthesizer circuits are often used to generate an output signal whose frequency bears a specified relationship to the frequency of an input reference signal. This may be used to generate an output clock signal having an accurate frequency, for example, based on an input clock signal having a known frequency.

A common form of frequency synthesizer is a phase-locked loop based circuit (PLL). A PLL receives an input signal and produces an output signal of substantially the same frequency with a predetermined phase relation to the input signal. A PLL can be used wherever it is necessary to synchronize the phase and/or frequency of two signals. In a typical communications type application, a PLL is used to synchronize a local oscillator to the frequency (and/or phase) of an incoming data signal. PLLs are widely used in space communications, for example, for coherent carrier tracking and threshold extension, bit synchronization, and symbol synchronization.

In one application, a PLL may be used to tune a high frequency local oscillator to a separate, more stable, lower-frequency local oscillator. For example, a very high frequency signal may be necessary for synchronizing to an incoming radio frequency signal at, for example, 800 MHz. Crystal oscillators are very stable and accurate, but typically do not operate at high enough frequencies to be used directly for high radio frequency applications. Thus, a high frequency voltage controlled oscillator (VCO) may be utilized, which generates the desired high frequency very precisely, by placing the VCO in a phase locked loop with a crystal oscillator.

A PLL typically comprises a phase and/or frequency comparator (e.g., a phase detector [PD] or phase/frequency detector [PFD]), which receives and compares an external input signal (or a divided version of this signal, which is used as a reference signal) to the output signal generated by a VCO (or a divided version of this signal), a "charge pump" for receiving the output of the PD or PFD, and a low pass "loop" filter which receives the output of the phase comparator and provides an output control voltage to the VCO. A common form of VCO for use in a PLL is a ring oscillator that employs a series of delay elements to provide the desired frequency range of operation.

The PFD forms a difference signal by comparing the external input signal and the VCO signal. In one type of PFD, the difference signal consists of UP (fast) and DOWN (slow) pulse signals, which are applied to the charge pump. The charge pump generates charge based on the UP or DOWN signals, which charge is integrated by the loop filter to produce a DC control voltage. This DC control voltage controls the output frequency of the VCO. When the frequency and phase of the signals compared by the PFD are substantially identical, the PLL is said to be in a state of lock (both frequency and phase lock). Because of the closed loop nature of a PLL and the negative feedback employed, the output frequency of the VCO is maintained to closely match the frequency of the reference input signal. A PLL may be used, therefore, to cause the output signal of the VCO to be locked to a stable reference frequency. For this reason, a PLL is often employed to generate an output reference signal, at a desired frequency, that is frequency and phase locked relative to some input reference signal.

Typically, the output clock signal and the input clock signal are each multiples of some common, lower frequency. For example, a 10 MHz input clock signal and a 25 MHz output clock signal are both multiples of 5 MHz. Thus, in the PLL, the 10 MHz input clock signal may be divided by 2 to provide a "common denominator" reference signal 5 MHz signal, and the 25 MHz output clock signal may be divided by 5 to provide a feedback signal of nominal frequency 5 MHz, for comparison by the PFD. (Alternatively, the VCO may itself generate a higher frequency, such as 50 MHz, which is divided by 2 to provide the 25 MHz output clock signal, and divided by 10 to provide the 5 MHz feedback signal.)

PLLs can take a significant but unspecific and unpredictable number of input clock cycles to achieve the lock condition. There is therefore a need to know whether and when lock has occurred, or when it is safe to assume that the PLL has achieved lock. For example, this determination can be used to change certain loop parameters to ensure narrow loop tracking in order to reject noise and other interfering signals. Thus, there is a need for lock detection circuitry to detect when the PLL is locked, i.e. when the frequency and the phase of an output signal matches the frequency and phase of an input signal. PLLs and lock detection techniques are described in further detail in Floyd Martin Gardner, *Phaselock Techniques*, 2nd ed. (Wiley 1979); Roland E. Best, *Phase-Locked Loops* (McGraw-Hill 1993); C. R. Hogge, "A Self Correcting Clock Recovery Circuit," *Journal of Lightwave Technology*, Vol. LT-3, No. 6 (December 1985), pp. 1312–1314.

One approach is to assume some predetermined, finite, maximum lock time during which the PLL should have locked. This maximum lock time is usually specified very conservatively, often five or more times longer than the typical lock time. A lock detect circuit may simply count this specified maximum lock time and then indicate the lock condition exists after the specified maximum lock time has elapsed. One disadvantage of this approach is that system time is wasted when lock occurs earlier than the maximum lock time, which is most of the time. Another disadvantage is that if lock is subsequently lost, or if lock is for some reason not achieved by the maximum lock time, there is no indication of the loss of lock and, indeed, there is an erroneous lock indication.

Another technique employs two counters, one from the input clock and one from the output clock. After a fixed number of the input clock cycles (a "test cycle"), the count of the output clock counter is examined to determine if it is the correct value (usually±one count or cycle of where the output clock should be after the fixed number of input clock cycles). Such a determination requires knowledge of the desired ratio between the frequencies of the input or reference clock and the output clock. If the output clock counter value is correct (i.e., within the specified degree of tolerance), the circuit is considered to be locked and an output indicator for lock is set. If the value is incorrect, both counters are restarted and the process is repeated. A disadvantage of this approach is that certain conditions can lead to a false lock indication. For example, the output clock may still be wandering but may have an average frequency equal to that of the reference clock, thus yielding the expected counter value, within the acceptable tolerance, even though there is really no lock yet. Alternatively, if there is frequency lock but not phase lock, this technique may indicate a lock before there is both phase and frequency lock. Additionally, the output clock might count to a much higher value than that for the reference clock (because it is higher frequency than the input clock), thereby causing the counter to overflow and start over again, and end up within the expected count range at the end of the test cycle even though the frequency of the output clock is far greater than it is supposed to be.

Yet another approach examines the "closeness" of the clock signal edges at the phase detector input. If the compared edges are nearly coincident for several repetitions (clock cycles), the circuit is considered to be locked and an indicator is set. A disadvantage of this technique lies in its use of analog techniques to accurately time the closeness of the edges. Further, if the loop has a static phase error, the loop may be actually locked but the edge-comparison approach would be unable to detect the lock and would thus (falsely) fail to provide a lock indication signal.

There is a need, therefore, for improved lock detector circuits and techniques for detecting when the PLL has achieved both frequency and phase lock.

SUMMARY

In the present invention, a lock detector and method are provided for detecting lock between a reference signal and a feedback signal of a PLL circuit. A number of clock cycles of the feedback signal is counted during consecutive test intervals defined by the reference signal. A feedback comparator determines whether the number of clock cycles of the feedback signal during a given test interval is within an expected range. Before lock has been indicated, a qualification counter is either incremented or reset after each test interval in accordance with the expected range determination. A lock indication signal indicating that lock has been achieved is provided if said qualification counter exceeds a qualification threshold.

DESCRIPTION OF THE PREFERRED EMBODIMENT

The present invention employs two counters, and a qualification counter (i.e. state walk) to achieve a robust lock detect. A reference (RF) counter times or counts the reference input to the phase frequency detector circuit of the PLL; a test counter counts the other input to the phase-frequency detector circuit; and a qualification counter ensures that the correct result (test counter matching the RF counter) occurs several consecutive times to provide robust indication of lock. In an embodiment, the lock monitor or detector circuit continues to operate after lock is achieved, to detect the loss of lock. These and other features and advantages of the present invention are described in further detail below.

Figure 1:
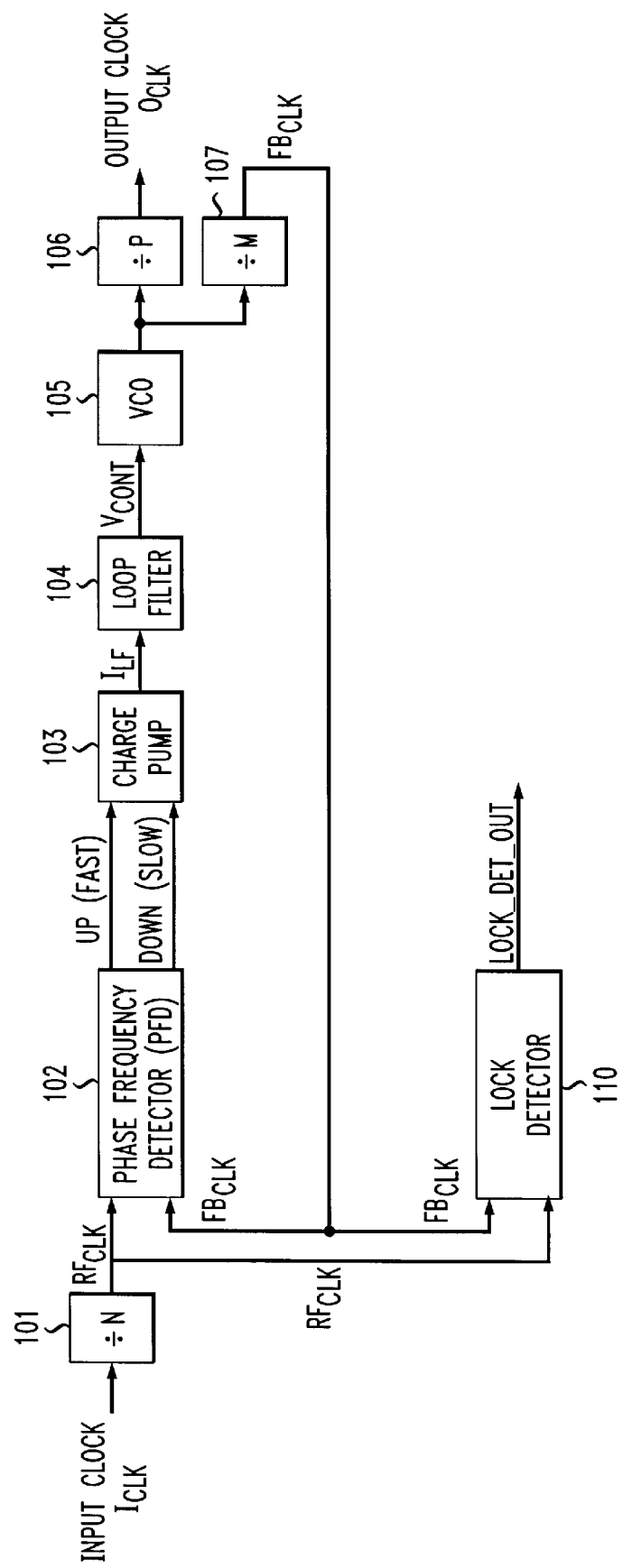
FIG. 1 is a block diagram illustrating a PLL-based frequency synthesizer employing a lock detector, in accordance with an embodiment of the present invention.

Referring now to FIG. 1, there is shown a block diagram illustrating a PLL-based frequency synthesizer circuit 100, which employs a lock detector 110, in accordance with an embodiment of the present invention. As shown, PLL circuit 100 comprises an initial ÷N unit 101, which receives input clock signal $I_{CLK}$, having an input frequency. Divider unit 101 divides the input clock signal $I_{CLK}$ to provide internal or common denominator reference clock signal $RF_{CLK}$, which has 1/N the frequency of the input clock signal. Phase frequency detector (PFD) 102 receives this reference clock signal $RF_{CLK}$ as well as the feedback clock signal $FB_{CLK}$, which has been produced by dividing the output of VCO 105 by M with divider unit 107. Thus, the output of VCO 105 is nominally M times the frequency of $RF_{CLK}$, or M/N times the frequency of $I_{CLK}$. The output of VCO 105 is divided by P by divider unit 106, to provide an output clock signal $O_{CLK}$ having a frequency which is M/(N·P) times the frequency of $I_{CLK}$.

For example, if the input clock $I_{CLK}$ is 10 MHz, and the desired output clock $O_{CLK}$ is 25 MHz, they are both multiples of 5 MHz. Thus, the common-denominator frequency 5 MHz may be used as the comparison frequency for PFD 102. To achieve this, N=2, and, for a VCO producing a nominally 50 MHz output signal, P=2 and M=0, in an embodiment.

As noted above, lock detector 110 maintains both a reference (RF) counter, which counts the number of cycles $RF_{CNT}$ of the $RF_{CLK}$ signal, and a test counter (FB counter) which counts the number of cycles $FB_{CNT}$ of the feedback signal $FB_{CLK}$. The RF counter counts down to 0 from an initial value over a given test interval. At the end of the test interval, as determined by the state of the reference counter, $FB_{CNT}$ is compared to $RF_{CNT}$ or its expected value, to see if the test counter value $FB_{CNT}$ is equal to its expected value, within a specified degree of tolerance. If the value is incorrect, i.e. $RF_{CNT}$ is outside an acceptable window, the reference and test counters are reset (or preset, depending upon the actual implementation), and the process is repeated.

If the value is correct, however, a qualification counter, e.g. implemented in a finite state machine (FSM), is incremented and the process is repeated until the qualification counter or FSM reaches a threshold value (e.g. three). If, at any time, the test counter indicates the incorrect value at the end of a test interval, the FSM is reset, and lock indication is turned off if it had previously been turned on. A lock indication is set if the qualification counter reaches the threshold value.

After lock is indicated by the qualification counter reaching its qualification threshold (i.e., the RF counter matching the test counter over a consecutive number of test intervals), the counter matching process continues to be successively repeated over successive test periods. Lock indicate is reset and the process is restarted, upon any compare that indicates loss of lock.

In one embodiment, the following parameters are utilized. The RF counter utilizes a seven-bit counter which counts 128 cycles, while the FB counter uses an eight-bit counter which can count 256 cycles (or 128 cycles with a sign). Each starts at the maximum value and counts down. When the RF counter has counted down from 111 1111 (128) to 000 0000, the end of the current test interval has been reached. At this point, the value of the FB counter should be binary 1000 0000 if the RF and FB incoming clocks were perfectly aligned. To account for imperfections in alignment, it is assumed, in an embodiment, that the counts $RF_{CNT}$, $FB_{CNT}$, can be as much as one count off (about a 1% error), and thus, when $RF_{CNT}$ reaches 000 0000 (i.e., 0), $FB_{CNT}$=1000 0001 (i.e., +1), 1000 0000 (i.e., 0), and 0111 1111 (i.e., −1) are accepted as valid indications of correct frequency, i.e. $FB_{CNT}$ "matches" $RF_{CNT}$ within a specified degree of tolerance. In general, the counts may be off by up to a specified number of counts (e.g., 1, 2, or another number) to still be a valid indication of correct frequency being produced by VCO 105, and thus an indication of the correct frequency of output clock $O_{CLK}$.

Figure 2:
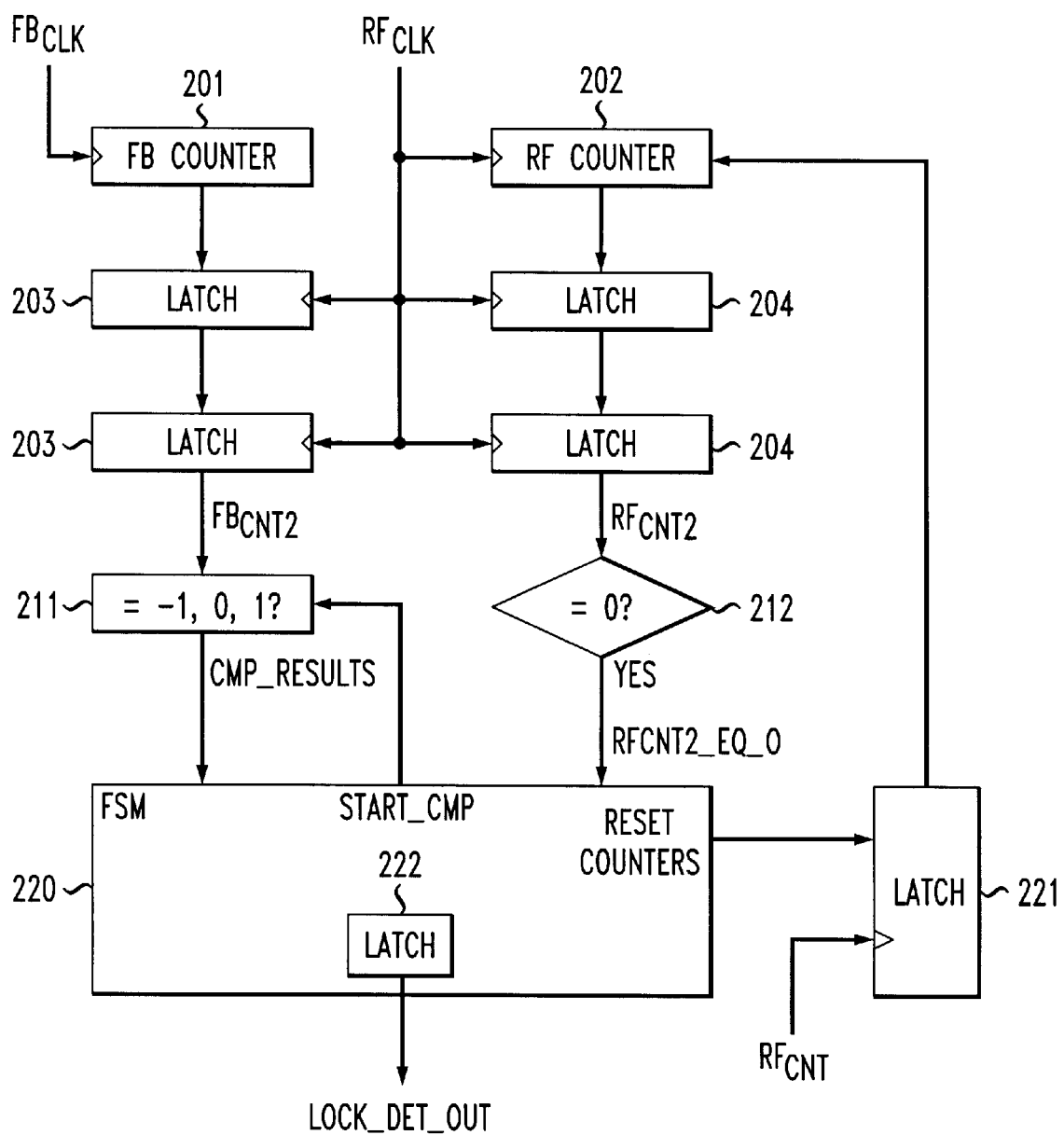
FIG. 2 is a block diagram illustrating the lock detector of FIG. 1 in greater detail.

Referring now to FIG. 2, there is shown a block diagram illustrating an embodiment of lock detector 110 of FIG. 1 in greater detail. As shown, lock detector 110 comprises at least one FB counter 201 and one RF counter 202. Each preferably is coupled to a pair of cascaded latches 203, 204, as shown, which receive the $RF_{CLK}$ input signal at their clock inputs. This serves to re-time the values of counters 201, 202 in accordance with the $RF_{CLK}$ input signal to prevent any metastable values for the comparisons of comparator unit 211.

Initially, at the beginning of every counter comparison or test interval, RF counter 202 has a value $RF_{CNT}$=128=111 1111, and FB counter 201 is loaded with a value $FB_{CNT}$=1111 1111. Each being counting down. When $RF_{CNT}$ reaches 000 0000, comparator 212 provides a signal RFCNT2_EQ_0 (i.e. $RF_{CNT}$=0) to FSM 220, which causes a START_CMP (start compare) signal to be sent to compare unit 211, which then checks to see if $FB_{CNT}$ is within the tolerated range, i.e. whether $FB_{CNT}$=−1, 0, or +1. If successful, the CMP_RESULTS is turned high, which causes FSM 220 to increment its qualification counter, and also to reset the counters 201, 202 with reset unit 221 (also re-timed in accordance with the $RF_{CLK}$ input signal to avoid metastability problems), to begin another test interval and FB, RF comparison process. When FSM 220 increments its qualification counter, if it reaches the qualification threshold (e.g., 3), it switches latch 222 to high to provide the lock indication by the LOCK_DET_OUT signal. Once lock has been indicated, then LOCK_DET_OUT remains high so long as CMP_RESULT is indicated as high at the end of each test interval counter comparison. The qualification counter stops incrementing once lock is indicated. If ever CMP_RESULT switches to low after a comparison by unit 211 at the end of a test interval, latch 222 is cleared to stop asserting an active LOCK_DET_OUT signal.

Thus, even after lock is indicated, FSM 220 keeps resetting FB and RF counters 201, 202 over again to repeat the counter comparison process, so that, if CMP_RESULTS indicates a lack of match between the FB and RF counters, then FSM 220 turns off the LOCK_DET_OUT signal so that external elements receiving the signal immediately know that lock has been lost.

Figure 3:
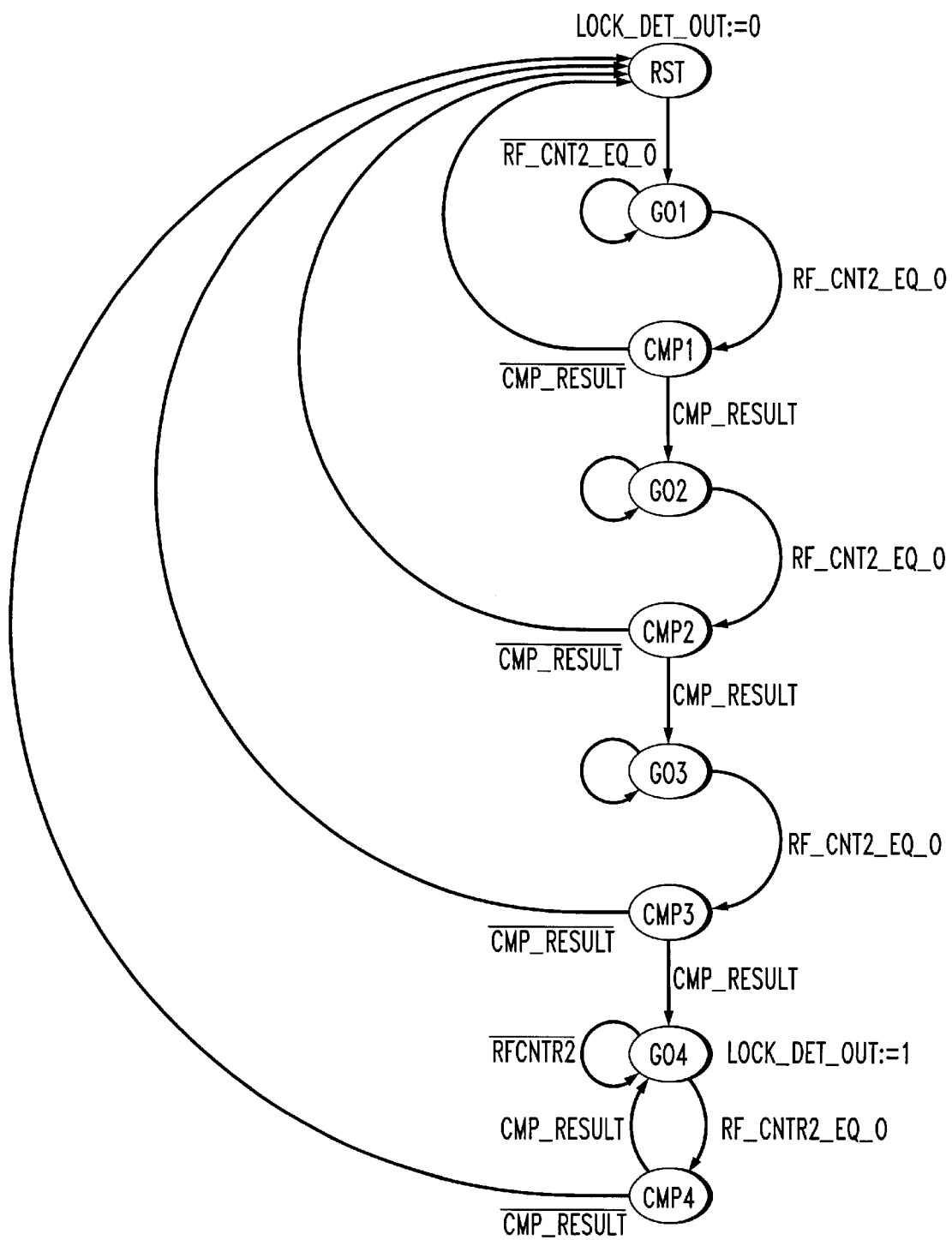
FIG. 3 is a state diagram illustrating the operation of the lock detector of FIG. 2.

Referring now to FIG. 3, there is shown a state diagram of FSM 220, to illustrate the operation of lock detector 110 of FIG. 2. State GO1 is the initial state, which is maintained until a valid comparison of $RF_{CNT}$ to 0 by unit 212 indicates that the end of the test interval has been reached. Thus, when RFCNT2_EQ_0 goes high, state CMP1 is reached, i.e. unit 211 compares $FB_{CNT2}$ to see if it is equal to −1, 0, or +1. If it is not, the process is reset by entering reset state RST. State RST clears latch 222, to set LOCK_DET_OUT to 0, to ensure that the lock indication is de-asserted whenever the lock indication states (GO4, CMP4) are exited by returning to state RST. However, if CMP_RESULT is high, then state GO2 is reached, effectively incrementing the qualification counter. When state GO2 is reached, the FB and RF counters are set to their start value and another test interval is started.

A similar process to that described above is repeated for both states GO2 and GO3.

Thus, state GO3 is reached after two successful test intervals. At the end of the third test interval, RFCNT2_EQ_0 turns high, causing CMP3 to test whether $FB_{CNT}$ has a correct result for the third successive time. If not, the process is reset; but if so, CMP_RESULT is high and CMP3 transitions to lock indication state GO4. This state causes latch 222 to be set, to set LOCK_DET_OUT:=1. In state GO4, test intervals are successively repeated so long as the CMP_RESULT resulting from state CMP4 is high. Whenever lock is lost, as indicated by CMP_RESULT going low, the reset state RST is entered, which clears the LOCK_DET_OUT signal.

Thus, lock detect circuit 110 of the present invention remains in lock indication state GO4 as long as the compare is acceptable, continuing to monitor the correct relationship between the two input clocks. Thus, if at any time after lock is achieved, a disturbance causes loss of lock, the loss of lock can be detected, as long as the RF clock is present.

As will be appreciated, when the LOCK_DET_OUT signal is asserted by lock detector 110, this is due to the RF counter matching the test counter matching over a consecutive number (e.g. 3) of test intervals. The LOCK_DET_OUT signal therefore is an indication of frequency lock. However, it can also safely be assumed that when frequency lock is achieved a consecutive number of times in a row, then phase lock has also been achieved, due to the presence of PFD 102. That is, if true frequency lock has been achieved, it is safe to assume that, after a multiple, consecutive number of test intervals indicating match, PFD 102 will have been able to have achieved phase lock as well. On the other hand, if for some reason PFD 102 is unable to establish phase lock, then it is unlikely that a count match will be achieved for three consecutive test intervals. Therefore, the LOCK_DET_OUT signal may be considered to be an indication of both frequency and phase lock. The lock detection technique of the present invention is thus able to indicate phase lock even if the loop has a static phase error. As will further be appreciated, lock detector circuit 110 detects a lock between the reference signal $RF_{CLK}$ and the feedback signal $FB_{CLK}$. However, when the feedback signal $FB_{CLK}$ has locked onto the reference signal $RF_{CLK}$, the output clock $O_{CLK}$ has also locked to the stable input reference clock signal $I_{CLK}$. Thus, the LOCK_DET_OUT signal may be considered to be an indication of both frequency and phase lock for the $FB_{CLK}$ signal relative to the $RF_{CLK}$ signal, or of both frequency and phase lock for the $O_{CLK}$ signal relative to the $I_{CLK}$ signal.

In an alternative embodiment, a quick loss of lock indication may be provided by employing two additional counters that are smaller counts than the RF and FB counters described previously. The comparison is reversed as well, so if the reference count disappears entirely, the compare would indicate an unlocked condition. These two counters would be enabled only if lock is achieved.

In an embodiment, the FB counter does not roll over. E.g., it may be stopped at 0000 0000 or some intermediate point such as 0111 1100, to prevent false detection of acceptable counts in situations where the FB clock was 3, 5, 7, etc. times faster than the RF clock to the circuit.

In alternative embodiments, the length of the RF counter and FB counter are varied, in accordance with tradeoffs between accuracy and speed of lock detection, depending upon the relative importance of these factors in a particular implementation or application. Additionally, in an alternative embodiment, the qualification threshold may be increased by adding more states to the FSM.

Thus, the present invention provides an all-digital method using the lower frequency signals at the PFD input to generate a robust indication of lock and loss of lock. The lock detector of the present invention may be implemented as a custom block, a synthesized block, or a netlist of standard cell. The present invention therefore proves a means for providing a lock indication and a loss of lock indication.

Some or all of the components of circuit 100 of the present invention may be fabricated as an integrated circuit (IC), within a semiconductor chip. Chips are formed in the substrate of a physical wafer, e.g. a silicon wafer. Typically, several chips are formed in each wafer. A wafer is a very thin, flat disc of a given diameter. The manufacturing process consists of operations on the surface and substrate of the wafer to create a number of chips. Once the wafer is completely processed, it is cut up into the individual chips.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for detecting lock between a reference signal and a feedback signal, comprising the steps of:
    (a) counting a number of clock cycles of the feedback signal during consecutive test intervals defined by counting a number of clock cycles of the reference signal;
    (b) determining whether the number of clock cycles of the feedback signal during a given test interval is equal to an expected value within a specified degree of tolerance;
    (c) before lock has been indicated, incrementing or resetting a qualification counter after each test interval in accordance with the determination of step (b); and
    (d) indicating that lock has been achieved if said qualification counter exceeds a qualification threshold.

2. The method of claim 1, wherein said qualification threshold is three.

3. The method of claim 1, wherein step (b) comprises the step of determining whether the number of clock cycles of the feedback signal during the given test interval is equal to the number of clock cycles of the reference signal during the given test interval within a degree of tolerance.

4. The method of claim 1, further comprising the step of:
    (e) after lock has been indicated, consecutively repeating steps (a) and (b) and resetting the qualification counter and indicating that lock has not been achieved if the number of clock cycles of the feedback signal, for a subsequent test interval, is determined not to be within equal to said expected value within said specified degree of tolerance.

5. The method of claim 1, wherein step (c) comprises the steps of incrementing the qualification counter after a test interval if the number of clock cycles of the feedback signal for a given test interval is determined to be equal to said expected value within said specified degree of tolerance and resetting the qualification counter otherwise.

6. A method in accordance with claim 1, wherein:
    (e) while lock is indicated, counting a number of clock cycles of the feedback signal during consecutive test intervals defined by the reference signal; and
    (f) determining whether the number of clock cycles of the feedback signal during a given test interval while lock is indicated is equal to an expected value within a specified degree of tolerance, wherein a test interval while lock is indicated is less than a test interval when lock is not indicated; and
resetting the qualification counter and removing lock indication if the number of clock cycles of the feedback signal, for a subsequent test interval while lock is indicated, is determined not to be equal to said expected value within said specified degree of tolerance.

7. An integrated circuit having a lock detector for detecting lock between a reference signal and a feedback signal, the lock detector comprising:
    (a) a feedback counter for counting a number of clock cycles of the feedback signal during consecutive test intervals defined by counting a number of clock cycles of the reference signal;
    (b) a comparator for determining whether the number of clock cycles of the feedback signal during a given test interval is equal to an expected value within a specified degree of tolerance; and
    (c) a finite state machine for incrementing or resetting a qualification counter, before lock has been indicated, after each test interval in accordance with the determination of said comparator and for providing a lock indication signal if said qualification counter exceeds a qualification threshold.

8. The integrated circuit of claim 7, wherein said qualification threshold is three.

9. The integrated circuit of claim 7, wherein the comparator determines whether the number of clock cycles of the feedback signal during the given test interval is equal to the number of clock cycles of the reference signal during the given test interval within a degree of tolerance.

10. The integrated circuit of claim 7, wherein the finite state machine is for consecutively repeating steps (a) and (b), after lock has been indicated, and resetting the qualification counter and removing the lock indication signal if the number of clock cycles of the feedback signal, for a subsequent test interval, is determined not to be equal to said expected value within said specified degree of tolerance.

11. The integrated circuit of claim 7, wherein the finite state machine increments the qualification counter after a test interval if the number of clock cycles of the feedback signal for a given test interval is determined to be equal to said expected value within said specified degree of tolerance and resets the qualification counter otherwise.

12. The integrated circuit of claim 7, further comprising:
    a reference counter for counting down, during a given test interval, from an initial reference counter value to 0; and
    a reference comparator for comparing the reference counter value to 0 to indicate the end of a given test interval.

13. The integrated circuit of claim 12, further comprising a pair of cascaded latches, for each of the reference and feedback counters, for latching said reference and feedback counter values, respectively, each of said latches coupled to the reference signal at a clock input to avoid metastability problems.

14. An integrated circuit in accordance with claim 7, wherein:
    (e) while lock is indicated, counting a number of clock cycles of the feedback signal during consecutive test intervals defined by the reference signal; and (f) determining whether the number of clock cycles of the feedback signal during a given test interval while lock is indicated is equal to an expected value within a specified degree of tolerance, wherein a test interval while lock is indicated is less than a test interval when lock is not indicated; and resetting the qualification counter and removing lock indication if the number of clock cycles of the feedback signal, for a subsequent test interval while lock is indicated, is determined not to be equal to said expected value within said specified degree of tolerance.

* * * * *